United States Patent
Takahashi et al.

(10) Patent No.: US 6,265,129 B1
(45) Date of Patent: Jul. 24, 2001

(54) POSITIVE PHOTOSENSITIVE COMPOSITIONS FOR APPLICATION OF THE LIFT-OFF TECHNIQUE AND A METHOD OF FORMING PATTERNS USING THE COMPOSITIONS

(75) Inventors: Koichi Takahashi, West Lothian (GB); Tetsuya Kato; Tomosaburo Aoki, both of Kanagawa-ken (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 08/966,419

(22) Filed: Nov. 7, 1997

(30) Foreign Application Priority Data

Nov. 11, 1996 (JP) .................................................. 8-314284

(51) Int. Cl.⁷ .............................. G03F 7/023; G03F 7/30
(52) U.S. Cl. ..................... 430/192; 430/165; 430/191; 430/193; 430/326; 430/329; 430/330
(58) Field of Search ................................. 430/192, 193, 430/165, 191, 326, 330, 329

(56) References Cited

U.S. PATENT DOCUMENTS

| 572,504 | * | 3/1998 | Hosoda et al. ..................... 430/192 |
| 5,306,596 | * | 4/1994 | Oie et al. ........................... 430/192 |
| 5,314,783 | * | 5/1994 | Koibuchi et al. ................... 430/191 |
| 5,429,905 | * | 7/1995 | Tan et al. ........................... 430/192 |
| 5,501,936 | * | 3/1996 | Hosoda et al. ..................... 430/191 |
| 5,532,107 | * | 7/1996 | Oie et al. ........................... 430/192 |
| 5,612,164 | * | 3/1997 | Canize et al. ...................... 430/192 |
| 5,629,127 | * | 5/1997 | Oosedo et al. ..................... 430/191 |
| 5,629,128 | * | 5/1997 | Shirakawa et al. ................. 430/192 |
| 5,658,469 | | 8/1997 | Jennison ............................... 216/22 |
| 5,747,218 | * | 5/1998 | Momota et al. ..................... 430/192 |
| 5,773,200 | * | 6/1998 | Okazaki et al. .................... 430/324 |
| 5,912,102 | * | 6/1999 | Kawata et al. ..................... 430/191 |

FOREIGN PATENT DOCUMENTS 8-69111    3/1996   (JP) .

OTHER PUBLICATIONS

R. Nakano et al., "Effect of Low–Molecular–Weight Novolak Resin on Microgrooves", Japanese Journal of Applied Physics, vol. 30, No. 11B, pp. 3121–3124, Nov. 1991.

* cited by examiner

Primary Examiner—John S. Chu
(74) Attorney, Agent, or Firm—Wenderoth, Lind & Ponack, L.L.P.

(57) ABSTRACT

Improved positive photosensitive composition for application of the lift-off technique comprises (A) an alkali-soluble resin and (B) a mixture of two photosensitive agents in admixture with the alkali-soluble resin, one being (i) a photosensitive agent which shows the tendency to form a resist pattern of a feature profile having a micro-groove upon exposure and the other being (ii) a photosensitive agent which does not show the stated tendency but shows the tendency to form a resist pattern having a rectangular or tapered cross-sectional feature profile upon exposure and using the composition, one can form half-a-micron meter and even finer conducting patterns, electrodes or insulation patterns in a highly reproducible manner.

12 Claims, 4 Drawing Sheets

POSITIVE PHOTOSENSITIVE COMPOSITIONS FOR APPLICATION OF THE LIFT-OFF TECHNIQUE AND A METHOD OF FORMING PATTERNS USING THE COMPOSITIONS

BACKGROUND OF THE INVENTION

1. Field of the Invention

This invention relates to positive photosensitive compositions for application of the lift-off technique and a method of forming patterns using the compositions. More particularly, the invention relates to positive photosensitive compositions for application to the lift-off technique with which half-a-micron order or even finer patterns such as conducting patterns and electrodes made of metals or metal oxides, as well as insulation patterns can be formed precisely on the substrate. The invention also relates to a method of forming patterns using such compositions.

2. Description of Related Art

Conducting patterns and electrodes made of various metals such as aluminum, copper, tantalum, nickel-iron (Ni—Fe) or metal oxides such as aluminum oxide, as well as insulation patterns are formed on semiconductor and other substrates by various known methods including the lift-off technique. A typical process of the lift-off technique proceeds as follows: a photosensitive composition is coated on a substrate to form a resist layer, which is exposed via a mask and developed to form a resist pattern on the substrate; thereafter, a metal or metal oxide layer is formed by blanket deposition such as sputtering or chemical vapor deposition onto the entire surface of the substrate including the resist pattern; removing away the resist pattern then "lifts off" the overlying metal or metal oxide layer but leaves the metal or metal oxide intact on the substrate as a conducting pattern or electrodes.

Without involving an etching step, the lift-off technique has the advantage that patterns can easily be formed of difficult-to-etch metals and metal oxides; on the other hand, the lift-off technique uses the resist pattern as a mask in forming conducting patterns and electrodes of metals and metal oxides and, hence, the precision of their geometry depends on the profile of resist pattern elements. Under the circumstances, a need has arisen for photosensitive compositions that are suitable for application of the lift-off technique and which are capable of precise formation of fineline conducting patterns, electrodes and insulation patterns. A particularly great need has arisen in recent years for photosensitive compositions to which the lift-off technique is applicable and which are suitable for use in the formation of conducting metallization patterns in semiconductor devices, as well as in the formation of metal or metal oxide electrodes (terminals) on magnetic heads in magnetic disk devices such as a giant magnetoresistive (GMR) head and a magnetoresistive (MR) head.

It is generally held that resist pattern desired for application of the lift-off technique should have such a feature profile that it has an undercut (i.e., the narrowing of the bottom of a pattern element at the interface with the substrate). See Unexamined Published Japanese Patent Application No. 69111/1996 and Ritsuko Nakano et al., Japanese Journal of Applied Physics, vol. 30, No. 11B, November 1991, pp. 3121–3124. The undercut is commonly referred to as a "micro-groov" and believed to occur for the following reason: if a positive photosensitive composition is used, only that area which has been irradiated with light becomes soluble in a liquid alkali developer and the resulting resist pattern should inherently have a rectangular feature profile; however, in practice, due to some reason, the bottom of the pattern element which should theoretically be shadowed dissolves in the liquid developer to have an "undercut".

The micro-groove is preferred in the application of the lift-off technique for several reasons, among which the following are worth mention: when a metal or metal oxide layer (metallization) forms not only onto the entire surface of the substrate including the resist pattern but, the metallization will readily get into the space between adjacent resist elements to thereby form a conducting pattern or electrodes having a rectangular or tapered cross-sectional profile that assures good adhesion to the substrate; the resist pattern can easily be stripped from the substrate; hence, no adverse effects will be exerted on the geometry of the conducting pattern and electrodes when the resist pattern is removed away. These advantages are particularly noticeable when the metal or metal oxide layer is to be formed by sputtering.

Although the micro-groove has these advantages, the cause of its generation has not been fully unraveled and it is difficult to ensure that a pattern profile having micro-grooves can be reproduced in high precision; in addition, the degree of undercut in the bottom of a pattern element due to the micro-groove has been difficult to control in accordance with a specific case.

Furthermore, the heretofore proposed photosensitive compositions capable of forming micro-grooves produce resist patterns with a narrowed top and, hence, are unsatisfactory in geometry. The resist patterns are also poor in resolution. In other words, the conventional photosensitive compositions which are capable of forming micro-grooves are suit- able for forming rough patterns of a feature size of about 10 $\mu$m but not satisfactory for the purpose of precisely forming very fine ($\leqq 2$ $\mu$m) patterns, particularly superfine patterns of half-a-micron order or even finer patterns.

SUMMARY OF THE INVENTION

The present inventors conducted intensive studies in order to solve the aforementioned problems of the prior art and found that the propensity to the formation of micro-grooves depends on the type of photosensitive agent to be used and that the use of photosensitive agents having the tendency to form micro-grooves were generally prone to form undesired pattern feature profiles. Based on this finding, the present inventors continued their studies and found that when a photosensitive agent having the tendency to form micro-grooves was used in admixture with a photosensitive agent which would not form micro-grooves but which could form a resist pattern having a rectangular or tapered cross-sectional profile, one could form a resist pattern that had a micro-groove in each element and which yet was satisfactory in feature profile and resolution. The present invention has been accomplished on the basis of this finding.

An object, therefore, of the invention is to provide a positive photosensitive composition for application of the lift-off technique which is capable of forming half-a-micron order or even finer patterns having good feature profiles and which, hence, assures high reproducibility in forming precise conducting patterns, electrodes and insulation patterns.

Another object of the invention is to provide a method of forming patterns using the above-described positive photosensitive composition for application of the lift-off technique.

Thus, according to one aspect of the invention, there is provided a positive photosensitive composition for application of the lift-off technique, which comprises:

(A) an alkali-soluble resin; and
(B) a mixture of two photosensitive agents in admixture with the alkali-soluble resin, one being (i) a photosensitive agent which shows the tendency to form a resist pattern of a feature profile having a micro-groove upon exposure and the other being (ii) a photosensitive agent which does not show the stated tendency but shows the tendency to form a resist pattern having a rectangular or tapered cross-sectional feature profile upon exposure.

According to another aspect of the invention, there is provided a method of forming a resist pattern for application of the lift-off technique, which comprises the steps of coating a substrate with the stated positive photosensitive composition for application of the lift-off technique, drying the coating, exposing it at a specified wavelength, then heat treating it and developing it with an aqueous alkaline solution to form a resist pattern.

According to yet another aspect of the invention, there is provided a method of forming a pattern comprising the steps of forming a resist pattern on a substrate by the stated method, forming a metallization on the entire surface of the substrate including the resist pattern and subsequently removing away the resist pattern to lift off the overlying metallization to thereby form a patterned metallization on the substrate.

DESCRIPTION OF THE PREFERRED EMBODIMENTS

Examples of the alkali-soluble resin as component (A) include phenolic resins, acrylic resins, styrene-acrylic acid copolymers, hydroxystyrene homopolymers, polyvinyl phenol and poly-a-methyl vinyl phenol, all these being known as film-forming resins to be used in positive photosensitive compositions. Among these, phenolic resins are used preferably, with novolac resins being particularly advantageous since they provide for efficient development by readily dissolving in aqueous alkali solutions without swelling.

Exemplary phenolic resins include the products of polycondensation reaction between aromatic hydroxy compounds and aldehydes, the products of polycondensation reaction between aromatic hydroxy compounds and ketones, vinylphenolic polymers, isopropenylphenolic polymers and the products of hydrogenation reaction of these phenolic resins.

Exemplary aromatic hydroxy compounds that form these phenolic resins include: phenols such as phenol, m-cresol, p-cresol and o-cresol; xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenylphenol; arylphenols such as phenylphenol; and polyhydroxyphenols such as 4,4'-dihydroxybiphenyl, bisphenol A, resorcinol, hydroquinone and pyrogallol. These aromatic hydroxy compounds may be used either alone or in admixture. Among these aromatic hydroxy compounds, m-cresol, p-cresol, 2,5-xylenol, 3,5-xylenol and 2,3,5-trimethylphenol are particularly preferred.

Exemplary aldehydes include formaldehyde, paraformaldehyde, trioxane, acetaldehyde, propionaldehyde, butylaldehyde, trimethylacetaldehyde, acrolein, crotonaldehyde, cyclohexanealdehyde, furfural, furylacrolein, benzaldehyde, terephthaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamic aldehyde. These aldehydes may be used either alone or in admixture. Among these aldehydes, formaldehyde is preferred because of its easy availability. For the particular purpose of providing improved heat resistance, formaldehyde is preferably used in combination with hydroxybenzaldehydes.

Exemplary ketones include acetone, methyl ethyl ketone, diethyl ketone and diphenyl ketone. These ketones may be used either alone or in admixture. A particularly preferred combination of aromatic hydroxy compounds and ketones is that of pyrogallol and acetone.

The products of polycondensation reaction between aromatic hydroxy compounds and aldehydes or ketones can be prepared by known procedures in the presence of acidic catalysts. Examples of acidic catalysts that may be used include hydrochloric acid, sulfuric acid, formic acid, oxalic acid and paratoluenesulfonic acid. The resulting polycondensation products are preferably fractionated or otherwise treated to cut off the low-molecular weight region because this will provide better heat resistance. Fractionation and other treatments may typically be carried out by dissolving the resin as the polycondensation reaction product in good sol- vents such as alcohols (e.g. methanol and ethanol), ketones (e.g. acetone and methyl ethyl ketone), ethylene glycol monoethyl ether acetate and tetrahydrofuran, and then pouring the solution into water to form a precipitate.

Among the phenolic resins described above, novolac resins obtained by the polycondensation of formaldehyde with a mixture of aromatic hydroxy compounds selected from the group consisting of m-cresol, p-cresol, 2,5-xylenol, 3,5-xylenol and 2,3,5-trimethylphenol are particularly advantages for the purposes of the invention.

Exemplary vinylphenolic polymers include homopolymers of vinylphenol and copolymers thereof with copolymerizable monomers. Exemplary comonomers include acrylic acid derivatives, acrylonitrile, methacrylic acid derivatives, methacrylonitrile, styrene, styrene derivatives such as α-methylstyrene, p-methylstyrene, o-methylstyrene, p-methoxystyrene and p-chlorostyrene, as well as maleic anhydride and vinyl acetate.

Exemplary isopropenylphenolic polymers include homopolymers of isopropenylphenol and copolymers thereof with copolymerizable monomers. Exemplary comonomers include acrylic acid derivatives, acrylonitrile, methacrylic acid derivatives, methacrylonitrile, styrene, styrene derivatives such as α-methylstyrene, p-methylstyrene, o-methylstyrene, p-methoxystyrene and p-chlorostyrene, as well as maleic anhydride and vinyl acetate.

The products of hydrogenation reaction of phenolic resins are produced by dissolving them in organic solvents and introducing hydrogen into a homogeneous or inhomogeneous system in the presence of hydrogenation catalysts.

The alkali-soluble resin as component (A) is preferably selected from the weight-average molecular weight ($\overline{Mw}$) range of 2,000–20,000, more preferably from the range of 5,000–15,000, with the low-molecular weight region cut off. The weight-average molecular weight of calculated for polystyrene by gel permeation chromatography (GPC). If the alkali-soluble resins has an unduly low weight-average molecular weight (i), there is a tendency for the resist layer to experience an increased loss of width upon development; if the weight-average molecular weight of the alkali-soluble resin is unduly high, the development rate is prone to decrease.

The photosensitive agent as component (B) is a mixture of two photosensitive agents in admixture with the alkali-soluble resin, one being (i) a photosensitive agent which shows the tendency to form a resist pattern of a feature profile having a micro-groove upon exposure and the other being (ii) a photosensitive agent which does not show the stated tendency but shows the tendency to form a resist pattern having a rectangular or tapered cross-sectional feature profile upon exposure.

The photosensitive agent (i) in component (B) may be at least one compound represented by the following general formula (I):

(I)

where X is $OR^1$ (where $R^1$ is a hydrocarbon group of 1–3 carbon atoms) or a residue represented by the following general formula:

(where $R^2$ is a hydrocarbonyl group of 1–3 carbon atoms; m is an integer of 0–2; n is an integer of 1–3, provided that $1 \leq m+n \leq 4$), except that 75–100% of the phenolic hydroxyl groups in the compound (I) are esterified with naphthoquinonediazidosulfonic acid.

Examples of the compound represented by the general formula (I) include: methyl gallate represented by the following formula (IV):

(IV)

2,3,4,4'-tetrahydroxybenzophenone represented by the following formula (V):

(V)

as well as ethyl gallate, propyl gallate, 2,2',3,4-tetrahydroxybenzophenone, 2,3,3',4-tetrahydroxybenzophenone, 2,2',3,3',4-pentahydroxybenzophenone, 2,2',3,4,4'-pentahydroxybenzophenone and 2,2',3,4,4',5'-hexahydroxybenzophenone. Among these, methyl gallate and 2,3,4,4'-tetrahydroxybenzophenone are preferably used. In the particular case where the photosensitive composition of the invention is to be used as a positive photoresist for exposure to i-line (365 nm), methyl gallate is preferably used from the viewpoint of sensitivity and micro-groove formation.

The photosensitive agent (i) in component (B) is preferably such that 75–100% of the phenolic hydroxyl groups in the compound represented by the general formula (I) are esterified with naphthoquinonediazidosulfonic acid. If less than 75% of the phenolic hydroxyl groups in the compound (I) are esterified with naphthoquinonediazidosulfonic acid, the generation of micro-grooves is not satisfactory.

Any conventional method may be employed to esterify 75–100% of the hydroxyl phenolic groups in the compound of the general formula (I) and, in one example, naphthoquinone-diazidosulfonyl chloride may be condensed with the compound of the general formula (I). Stated specifically, the compound of the general formula (I) and naphthoquinone-1,2-diazido-4(or 5)-sulfonyl chloride are dissolved in specified amounts in organic solvents such as dioxane, n-methylpyrrolidone, dimethylacetamide and tetrahydrofuran and reaction is performed in the presence of added basic catalysts such as triethanolamine, pyridine, alkali carbonates and alkali hydrogencarbonates and the resulting reaction products are washed with water and dried.

The photosensitive agent (ii) in component (B) may be at least one compound represented by the following general formula (II):

(II)

where $R^3$–$R^{10}$ are each independently a hydrogen atom, a halogen atom, an alkyl group having 1–6 carbon atoms, an alkoxyl group having 1–6 carbon atoms or a cycloalkyl group; $R^{11}$–$R^{13}$ are each independently a hydrogen atom or an alkyl group having 1–6 carbon atoms; Q Is a hydrogen atom, an alkyl group having 1–6 carbon atoms or a residue represented by the following general formula (III):

(III)

(where $R^{14}$ and $R^{15}$ are each independently a hydrogen atom, a halogen atom, an alkyl group having 1–6 carbon atoms, an alkoxyl group having 1–6 carbon atoms or a cycloalkyl group; c is an integer of 1–3) or may combine with $R^{11}$ to form a cyclic ring having 3–6 carbon atoms; a and b are each an integer of 1–3; d is an integer of 0–3; and 1 is an integer of 0–2, except that 50–75% of the phenolic hydroxyl groups in the compound (II) are esterified with naphthoquinone-1,2-diazidosulfonic acid.

Preferred examples of the compound represented by the general formula (II) are those having at least three benzene nuclei and at least four phenolic hydroxyl groups. Examples of such compounds include: bis[2-hydroxy-3-(2'-hydroxy-5'-methylbenzyl)-5-methylphenyl]methane represented by the following formula (VI):

(VI)

bis(5-cyclohexyl-4-hydroxy-2-methylphenyl)-3,4-dihydroxyphenylmethane represented by the following formula (VII):

(VII)

as well as bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(5-cyclohexyl-4-hydroxyphenyl)-3,4-dihydroxyphenylmethane, bis(5-cyclohexyl-2-hydroxy-4-methylphenyl)-3,4-dihydroxyphenylmethane and bis(4-hydroxy-2,3,5-trimethylphenyl)-3,4-dihydroxyphenylmethane. Among these, bis(5-cyclohexyl-4-hydroxy-2-methylphenyl)-3,4-dihydroxyphenylmethane and bis[2-hydroxy-3-(2'-hydroxy-5'-methylbenzyl)-5-methylphenyl]methane are preferred, with bis[2-hydroxy-3-(2'-hydroxy-5'-methylbenzyl)-5-methylphenyl]methane being particularly preferred since in admixture with the photosensitive agent (i), it forms a resist pattern of a sharply defined feature profile while maintaining the micro-groove forming effect of the photosensitive agent (i) and, in addition, high resolution is ensured.

The photosensitive agent (ii) in component (B) is preferably such that 50–75% of the phenolic hydroxyl groups in the compound represented by the general formula (II) are esterified with naphthoquinonediazidosulfonic acid. If less than 50% of the phenolic hydroxyl groups in the compound (II) are esterified with naphthoquinonediazidosulfonic acid, satisfactorily high resolution is not attainable. If more than 75% of the phenolic hydroxyl groups are esterified with naphthoquinonediazidosulfonic acid, there occurs an undesired drop in sensitivity.

As in the case of the compound of the general formula (I), any conventional method may be employed to esterify 50–75% of the phenolic hydroxyl groups in the compound of the general formula (II) and, in one exemplary case, naphthoquinonediazidosulfonyl chloride may be condensed with the compound of the general formula (II). Stated specifically, the compound of the general formula (II) and naphthoquinone-1,2-diazido-4(or 5)-sulfonyl chloride are dissolved in specified amounts in organic solvents such as dioxane, n-methylpyrrolidone, dimethylacetamide and tetrahydrofuran and reaction is performed in the presence of added basic catalysts such as triethanolamine, pyridine, alkali carbonates and alkali hydrogencarbonates and the resulting reaction products are washed with water and dried.

The mixing ratio of the photosensitive agents (i) and (ii) in component (B) is preferably in the range of from 1:2 to 2:1 on a weight basis; when forming fine resist patterns having a feature width of about 0.35–1.00 μm, the mixing ratio of (i) to (ii) is preferably in the range of 1:2–1:1 whereas in forming resist patterns about 1.00–2.00 um in width, the mixing ratio of (i) to (ii) is preferably in the range of 1:1–2:1. As the proportion of the photosensitive agent (i) increases, more micro-grooves occur but at the same time, the top of a resist pattern element is more likely to be narrowed; these shape effects are by no means negligible in fine patterns and their depth of focus will decrease. To solve these problems, the proportion of the photosensitive agent (i) must be reduced. On the other hand, when forming comparatively large (ca. 1.00–2.00 μm) patterns, the shape effects are limited and in order to ensure the formation of extensive micro-grooves, the proportion of (i) must be increased as compared with (ii).

For the purposes of the invention, 25–40 parts by weight of component (B) is preferably incorporated per 100 parts by weight of component (A), the more preferred range being from 30 to 35 parts by weight of component (B). If less than 25 parts by weight of component (B) is incorporated, there will be no extensive occurrence of micro-grooves and the failure to obtain images faithful to the pattern results in poor pattern transfer. If more than 40 parts by weight of component (B) is incorporated, there occurs a drop in both sensitivity and the uniformity of the resulting resist film, eventually leading to poor resolution.

In addition to components (A) and (B), a phenolic compound (C) having at least two para-hydroxylphenyl groups may optionally be incorporated as a sensitizer in the photosensitive composition of the invention. The incorporation of such alkali-soluble phenolic compounds contributes to enhanced micro-groove formation. By proper adjustment of the amount of their incorporation, the degree of undercutting of the bottom of a pattern element due to the micro-groove can be controlled in a more effective manner.

Examples of the above-defined phenolic compound that may optionally be added as a sensitizer include: tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3,4-dihydroxyphenylmethane, 1-[1-(4-hydroxyphenyl)isopropyl]-4-[1,1-bis(4-hydroxyphenyl)ethyl]-benzene, 1-[1-(3-methyl-4-hydroxyphenyl)isopropyl]-4-[1,1-bis(3-methyl-4-hydroxyphenyl)ethyl]benzene, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4$^1$-hydroxyphenyl)propane, 2-(2,4-dihydroxyphenyl)-2-(4$^1$-hydroxyphenyl)propane, 2-(2,3,4-trihydroxyphenyl)-2-(41-hydroxyphenyl)propane, 2-(2,3,4-trihydroxyphenyl)-2-(4'-hydroxy-3',5'-dimethylphenyl)propane, bis(2,3,4-trihydroxyphenyl)methane, bis(2,4-dihydroxyphenyl)methane, 2,3,4-trihydroxyphenyl-41-hydroxyphenylmetahen, 1,1-di(4-hydroxyphenyl)cyclohexane and 2,4-bis[1-(4-hydroxyphenyl)isopropyl]-5-hydroxyphenol. Among these, bis(4-hydroxy-3-methylphenyl)-2-hydroxyphenylmethane, bis(4-hydroxy-2,3,5-trimethylphenyl)-2-hydroxyphenylmethane, 2,4-bis[1-(4-hydroxyphenyl)isopropyl]-5-hydroxyphenol and 1,1-di(4-hydroxyphenyl)cyclohexane are preferred. More preferred are bis(4-hydroxy-3-methylphenyl)-2-hydroxyphenylmethane, 2,4-bis[1-(4-hydroxyphenyl)isopropyl]-5-hydroxyphenol and 1,1-di(4-hydroxyphenyl)cyclohexane since these are effective in ensuring efficient formation of micro-grooves in combination with component (B). From the viewpoint of providing resist patterns of sharply defined feature profiles, bis(4-hydroxy-3-methylphenyl)-2-hydroxyphenylmethane and 2,4-bis[1-(4-hydroxyphenyl)isopropyl]-5-hydroxyphenol are preferred, with 2,4-bis[1-(4-hydroxyphenyl)isopropyl]-5-hydroxyphenol being most preferred.

Component (C) is soluble in aqueous alkali solutions and, further, in order to provide a highly photosensitive composition, it is desirably a compound that has only limited absorption in the wavelength range of the exposing light source. Particularly in the case of producing a photosensitive composition adapted to exposure to i-line (365 nm), the preferred compound is one having limited absorption of light at wavelengths near 300–500 nm.

Considering this fact, component (C) is preferably a phenolic compound represented by the following formula (VIII):

(VIII)

The amount of incorporation of component (C) may appropriately be adjusted in accordance with various factors such as the use of the pattern to be formed; preferably, component (C) is incorporated in about 30–60 parts by weight per 100 parts by weight of component (A). The addition of component (C) increases the tendency for a micro-groove to make a i greater undercut in the bottom of a pattern element (at the interface with the substrate). However, excessive addition of component (C) lowers the resolution and the depth of focus, potentially introducing difficulty in creating resist patterns of fine dimensions. Under these circumstances, component (C) is preferably added in about 30–40 parts by weight when forming fine (ca. 0.35–1.00 $\mu$m) patterns, and in about 40–60 parts by weight when forming 1–2 $\mu$m patterns, because a balance is attained between the degree of undercut by a micro-grooves, resolution and the depth of focus. It should, however, be noted that if resolution is more important than the undercut by a micro-groove for the purpose of forming a fine pattern, the amount of addition of component (C) may be less than 30 parts by weight. On the other hand, if a >2 $\mu$m pattern is to be formed with an enhanced micro-groove, more than 60 parts by weight of component (C) may be added.

Depending on the need, the positive photosensitive composition of the invention for application of the lift-off technique may further contain compatible additives such as anti-halation UV absorbers and anti-striation surfactants to such an extent that they will not be deleterious to the objects of the invention. Exemplary UV absorbers include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4$^1$-ethoxyazonbenzene, 4-diethylaminoazobenzene and curcumin. Exemplary surfactants include fluorine-containing surfactants such as Furolard FC-430 and FC-431 (tradenames of Sumitomo 3M, Ltd.) and F Top EF122A, EF122B, EF122C and EF126 (tradenames of Tohchem Products Co.). Customary additives may also be added, as exemplified by additional resins, plasticizers, stabilizers and contrast enhancers.

The composition of the invention is preferably used in the form of a solution that is prepared by dissolving components (A) and (B), optionally added component (C) and any other optional additive components in suitable solvents.

Exemplary solvents include: ketones such as acetone, methyl ethyl ketone, cyclohexanone, methyl isoamyl ketone and 2-heptanone; polyhydric alcohols such as ethylene glycol, propylene glycol, diethylene glycol, ethylene glycol monoacetate, propylene glycol monoacetate and diethylene glycol monoacetate, and derivatives thereof in ether forms such as monomethyl ether, monoethyl ether, monopropyl ether, monobutyl ether and monophenyl ether; cyclic ethers such as dioxane; and esters such as ethyl lactate, methyl acetate, ethyl acetate, butyl acetate, methyl pyruvate, ethyl pyruvate, methyl methoxypropionate and ethyl ethoxypropinate. These solvents may be used either alone or in admixture.

An embodiment of the invention will now be described with particular reference to the formation of a resist pattern.

Figure 1A:
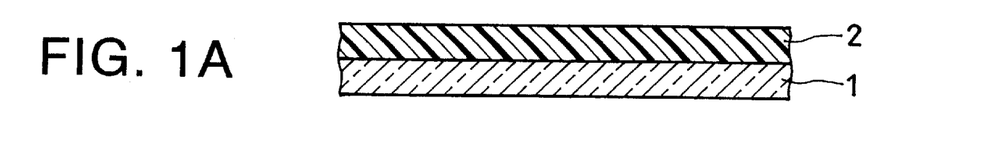
FIGS. 1A–IE show in schematic section the five major steps of forming a pattern by the method of the invention.

First, a substrate 1 (see FIG. 1A) such as a silicon wafer or a glass plate is spun or otherwise coated with a solution having the alkali-soluble resin (A), the photosensitive agent (B), as well as optional sensitizer (C) and any other optional additives in a suitable solvent (see above) and the applied solution is dried to form a photosensitive layer (photosensitive coating) 2.

Figure 1B:
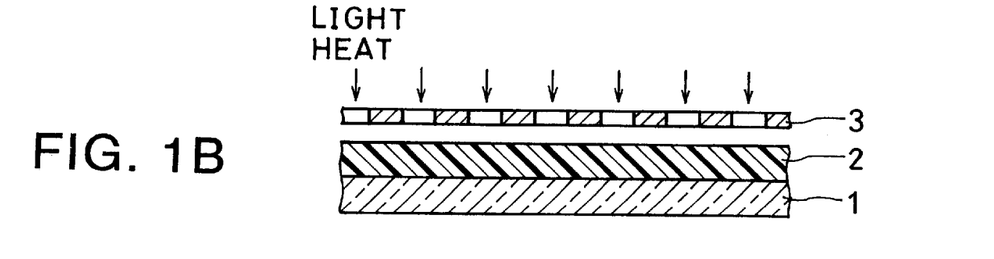

Then, the photosensitive layer 2 is selectively exposed via a mask pattern 3 (FIG. 1B). The exposure is performed by illumination with electromagnetic waves such as visible light, UV light, an excimer laser and X-rays, particularly light at wavelengths of 300–500 nm, in a sufficient amount to form a positive image. After the exposure, the substrate is heat treated at 100–14° C. The heating time is preferably in the range from about 1 to 90 seconds. The heat treatment at 100–140° C. is effective in enhancing the formation of satisfactory micro-grooves.

Figure 1C:
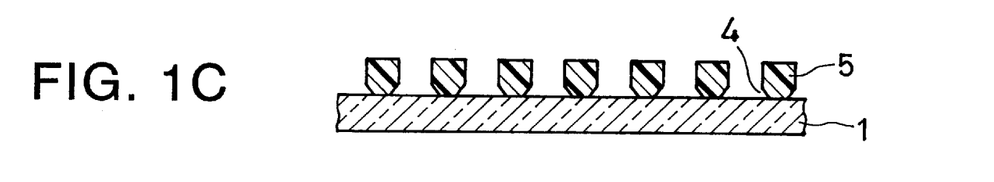

The substrate is then immersed in an aqueous alkaline solution such as an aqueous solution of 1–10 wt % tetramethylammonium hydroxide (TMAH), whereupon the exposed areas are selectively dissolved away to produce a resist pattern 5 faithful to the mask pattern and which had a micro-groove 4 in each feature (FIG. 1C).

Figure 1D:
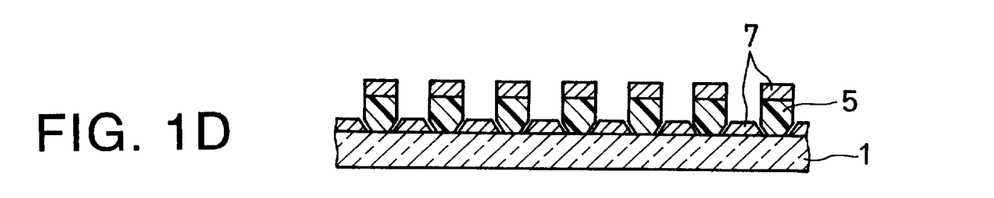

Subsequently, a metal (e.g. Al, Cu, Ta or Ni—Fe) or a metal oxide (e.g. $Al_2O_3$) layer (metallization) 7 was blanket deposited on the substrate 1 including the top surface of the resist pattern 5 by evaporation, sputtering or the like (FIG. 1D).

Figure 1E:
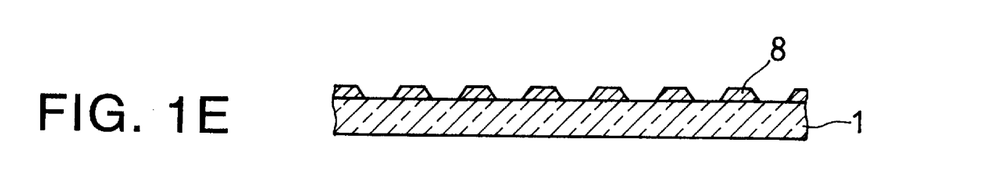

Thereafter, the resist pattern 5 was removed with a liquid stripper to "lift off" the overlying metallization 7, whereby a patterned metallization 8 such as a conducting pattern or an electrode was formed on the surface of the substrate 1 in areas other than where the resist pattern 5 had been present (FIG. 1E).

The conducting pattern or electrode formed by the invention is faithful to the mask pattern and has a precise rectangular or tapered feature profile.

The foregoing description refers to the case of forming a patterned metallization of a metal or a metal oxide. If desired, an insulation pattern having a precise rectangular or tapered feature profile can be formed of an insulating material.

The positive photosensitive composition of the invention for application of the lift-off technique has the advantage of forming half-a-micron order or even finer patterns that are highly precise and which have sharply defined feature profiles.

The following examples are provided for the purpose of further illustrating the present invention but are in no way to be taken as limiting.

EXAMPLES

In the examples that follow, positive photosensitive compositions were evaluated for their performance by the following methods.

Sensitivity

A sample was spin coated onto a silicon wafer and dried on a hot plate at 90° C. for 90 seconds to form a resist film 1.00 μm thick. The film was exposed on a reduction projection aligner NSR-2005i10D (NIKON Corp.; NA=0.50) for a length of time that was Increased from 0.1 second at 0.01-sec intervals. Thereafter, the wafer was heated at 110° C. for 90 seconds, developed in an aqueous solution of 2.38 wt % tetramethylammonium hydroxide (TMAH) at 23° C. for 65 seconds, washed with water for 30 seconds and dried. The minimal exposure time required for the film thickness in the exposed areas to become zero upon development was expressed in milliseconds (ms).

Resolution

In Examples 1–12 and Comparative Examples 1–6, the limit resolution was determined for the amount of exposure required to reproduce a mask pattern having a feature linewidth of 0.50 μm. In Examples 13 and 14, the limit resolution was determined for the amount of exposure required to reproduce a mask pattern having a feature linewidth of 1.50 μm.

Depth-of-focus Characteristic

With Eop (the amount of exposure necessary to produce a line-to-spacing ratio of 1:1 for a width of 0.50 μm) being used as a reference, exposure was performed on a reduction projection aligner NSR-2005i10D (NIKON Corp.; NA =0.50) under slightly defocused conditions. After development, the resulting resist patterns were examined by SEM microscopy. A maximum value (μm) of defocusing that allowed a rectangular resist pattern element to form in a width of 0.50 μm was designated as depth-of-focus characteristic. In Examples 13 and 14, the same evaluation procedure was repeated, except that 0.50 μm as the linewidth was replaced by 1.50 μm.

Pattern Feature Profile

Figure 2:
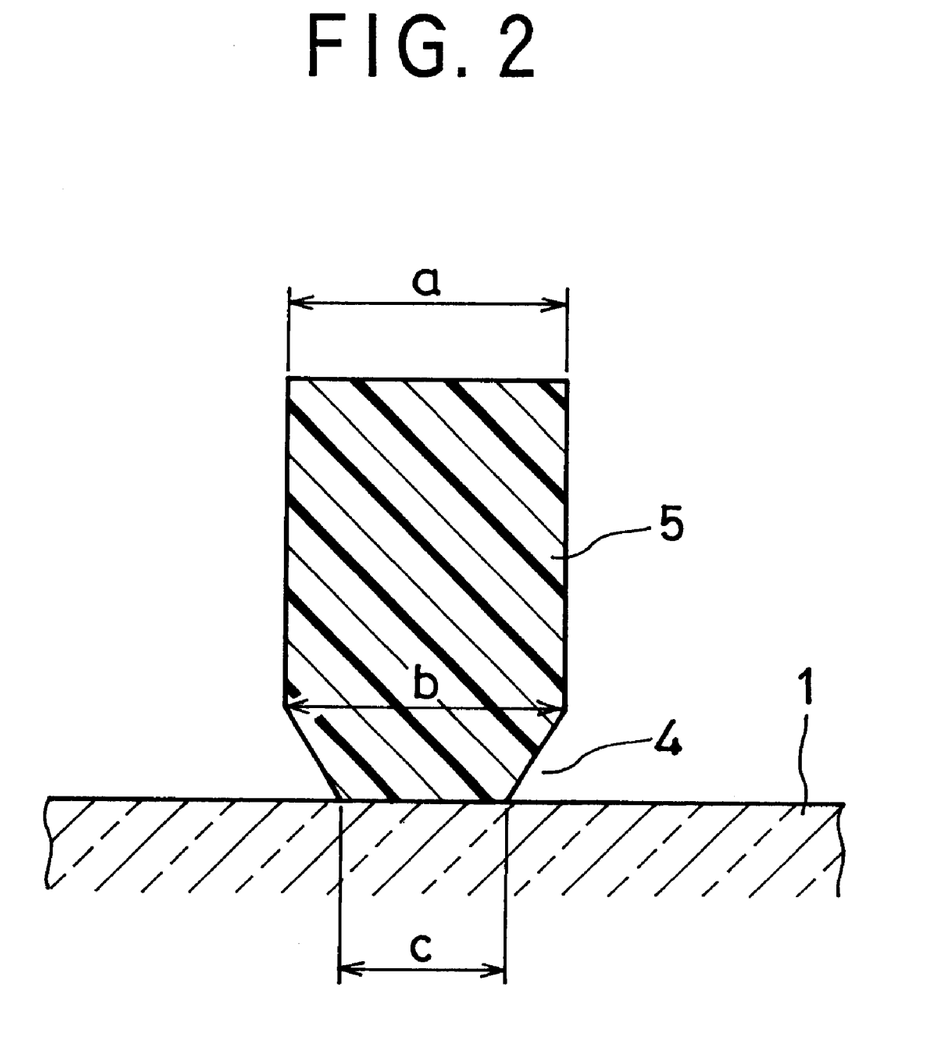
FIG. 2 shows a cross-sectional profile of a resist pattern element having a micro-groove.

Referring to FIG. 2 which shows the cross-sectional profile of a pattern element, symbol a designates the linewidth of the top of the element, b the linewidth of that part of the element which was contiguous to the micro-groove, and c the linewidth at the bottom of the element. The resist pattern formed in each of the samples was examined by SEM microscopy and the results were evaluated by the following criteria: ○, a and b were substantially equal and the profile of each pattern element was satisfactory; Δ, a>b or a<b and the profile of each pattern element was unsatisfactory; X, a and b were considerably different and the profile of each pattern element was far from being satisfactory. In FIG. 2, numeral 1 designates the substrate, 4 is the micro-groove and 5 is the resist pattern element.

Evaluation of Micro-groove

Referring to FIG. 2, the quality of micro-grooves was evaluated by the following criteria based on the value of [(b−c)/b]×100 (%) which relates c to b: A≧50%; 40%≦B<50%; 30%≦C<40%; D<30%.

Example 1

A 4:6 (by mole) mixture of m- and p-cresol was subjected to polycondensation with formaldehyde in the usual manner using an oxalic acid catalyst to prepare an alkali-soluble novolac resin having a weight-average molecular weight (Mw) of 8.000. The resulting novolac resin was freed of a low-molecular weight fraction to yield a weight-average molecular weight of 10,000. By similar procedures, an alkali-soluble novolac resin having a weight-average molecular weight of 9,000 was produced from a 35:40:25 (by mole) mixture of m-cresol, p-cresol and 2,3,5-trimethylphenol. The first mentioned novolac resin and the second novolac resin were mixed in a weight ratio of 1:3 to form an alkali-soluble resin component. A hundred parts by weight of this resin component, 10 parts by weight of product A of 100% esterification between methyl gallate (1 mole) and naphthoquinone-1,2-diazido-5-sulfonyl chloride (3 moles) and 20-parts by weight of product B of 50% esterification between bis[2-(hydroxy-3-(2'-hydroxy-5'-methylbenzyl)-5-methylphenyl)methane (1 mole) and naphthoquinone-1,2-diazido-5-sulfonyl chloride (2 moles) were dissolved in 400 parts by weight of 2-heptanone. The resulting solution was passed through a membrane filter having a pore size of 0.2 μm, thereby producing a coating system for a positive photosensitive composition for application of the lift-off technique. The thus prepared coating system was applied on to a hexamethyldisilazane coated silicon wafer and dried on a hot plate at 90° C. for 90 seconds to form a resist film 1.00 μm thick.

The film was exposed on a reduction projection aligner NSR-2005i10D (NIKON Corp.; NA=0.50; σ=0.60), then heated at 110° C. for 90 seconds and thereafter developed with an aqueous solution of 2.38 wt % tetramethylammonium hydroxide (TMAH) at 23° C. for 65 seconds, washed with water for 30 seconds and dried to form a 0.50 μm resist pattern.

Example 2

A coating system was prepared by repeating the procedure of Example 1, except that 30 parts by weight of 2,4-bis(1-[4-hydroxyphenyl)isopropyl]-5-hydroxyphenol was also added, and a resist pattern was formed using the coating system.

Example 3

A coating system was prepared by repeating the procedure of Example 2, except that the addition of 2,4-bis[1-(4-hydroxyphenyl)isopropyl]-5-hydroxyphenol was increased from 30 to 35 parts by weight, and a resist pattern was formed using the coating system.

Examples 4–12

Additional coating systems were prepared by repeating the procedure of Example 1, except that the species and the amount of addition of component (B) and the species of component (C) were changed as shown in Table 1, and resist patterns were formed using the coating systems.

Example 13

A resist pattern was formed by repeating the procedure of Example 2, except that the addition of 2,4-bis[1-(4-hydroxyphenyl)isopropyl]-5-hydroxyphenol was increased from 30 to 40 parts by weight and that the feature linewidth of the resist pattern was increased from 0.50 to 1.50 μm.

Example 14

A resist pattern was formed by repeating the procedure of Example 2, except that the addition of 2,4-bis[1-(4-hydroxyphenyl)isopropyl]-5-hydroxyphenol was increased from 30 to 50 parts by weight and that the feature linewidth of the resist pattern was increased from 0.50 to 1.50 μm.

Comparative Example 1

A coating system was prepared by repeating the procedure of Example 1, except that the mixture of esterified products A (10 parts by weight) and B (20 parts by weight) was replaced by 30 parts by weight of esterified product B alone, and a resist pattern was formed using the coating sys- tem.

Comparative Example 2

A coating system was prepared by repeating the procedure of Example 1, except that the mixture of esterified products A (10 parts by weight) and B (20 parts by weight) was replaced by 30 parts by weight of esterified product A alone, and a resist pattern was formed using the coating system.

Comparative Example 3

A coating system was prepared by repeating the procedure of Example 1, except that the degree of esterification of product A was reduced from 100% to 50%, and a resist pattern was formed using the coating system.

Comparative Example 4

A coating system was prepared by repeating the procedure of Example 1, except that the methyl gallate was replaced by 2,3,4-trihydroxybenzophenone, and a resist pattern was formed using the coating system.

Comparative Example 5

A coating system was prepared by repeating the procedure of Example 1, except that component (B) consisting of esterified products A (10 parts by weight) and B (20 parts by weight) was replaced by 30 parts by weight of product E of 100% esterification between 2,3,4-trihydroxybenzophenone (1 mole) and naphthoquinone-1,2-diazido-5-sulfonyl chloride (3 moles), and a resist pattern was formed using the coating system.

Comparative Example 6

A coating system was prepared by repeating the procedure of Example 1, except that the degree of esterification of product B was increased from 50% to 100%, and a resist pattern was formed using the coating system.

The coating systems prepared in Examples 1–14 and Comparative Examples 1–6 were measured for sensitivity, resolution and depth-of-focus characteristics. Evaluation was also made for the resist patterns formed using the respective coating systems. The results are shown in Table 1.

TABLE 1

| | | Component(B)* | | | | | | | |
|---|---|---|---|---|---|---|---|---|---|
| | (i) (degree of esterification) | (ii) (degree of esterification) | (i)/(ii) (proportions) | Component (C)**, wt % | Sensitivity ms | Resolution, μm | Depth of focus, μm | Feature profile | Microgroove quality |
| EXAMPLE | | | | | | | | | |
| 1 | A(100) | B(50) | 10/20 | — | 300 | 0.50 | 2.0 | ○ | B |
| 2 | A(100) | B(50) | 10/20 | Z1(30) | 160 | 0.45 | 1.8 | ○ | B |

TABLE 1-continued

| | Component(B)* | | | | | | | | |
|---|---|---|---|---|---|---|---|---|---|
| | (i) (degree of esterification) | (ii) (degree of esterification) | (i)/(ii) (proportions) | Component (C)**, wt % | Sensitivity ms | Resolution, μm | Depth of focus, μm | Feature profile | Micro-groove quality |
| 3 | A(100) | B(50) | 10/20 | Z1(35) | 150 | 0.45 | 1.6 | ○ | A |
| 4 | A(100) | B(50) | 12/24 | Z1(35) | 150 | 0.45 | 1.8 | ○ | A |
| 5 | A(100) | B(50) | 15/15 | Z1(35) | 170 | 0.45 | 1.5 | ○ | A |
| 6 | A(100) | B(50) | 20/10 | Z1(35) | 180 | 0.45 | 1.3 | Δ | A |
| 7 | C***(100) | B(50) | 15/15 | Z1(35) | 150 | 0.50 | 1.6 | ○ | A |
| 8 | A(100) | D(50) | 15/15 | Z1(35) | 130 | 0.45 | 1.7 | ○ | B |
| 9 | A(100) | B/D(50) | 15/7.5/7.5 | Z1(35) | 170 | 0.45 | 1.9 | ○ | B |
| 10 | A(100) | B(50) | 10/20 | Z2(35) | 150 | 0.45 | 1.6 | ○ | A |
| 11 | A(100) | B(50) | 10/20 | Z3(35) | 160 | 0.45 | 1.8 | ○ | B |
| 12 | A(100) | B(50) | 10/20 | Z4(35) | 150 | 0.45 | 1.4 | Δ | A |
| 13 | A(100) | B(50) | 20/10 | Z1(40) | 110 | 0.80 | 1.4 | ○ | B |
| 14 | A(100) | B(50) | 20/10 | Z1(50) | 100 | 1.00 | 1.4 | ○ | A |
| COMPARATIVE EXAMPLE | | | | | | | | | |
| 1 | — | B(50) | 0/30 | — | 200 | 0.40 | 1.8 | ○ | D |
| 2 | A(100) | — | 30/0 | — | 350 | 0.50 | 1.0 | X | D |
| 3 | A(50) | B(50) | 10/20 | — | 300 | 0.45 | 1.6 | Δ | C |
| 4 | E(100) | B(50) | 10/20 | — | 300 | 0.50 | 1.0 | Δ | D |
| 5 | E(100) | — | 30/0 | — | 350 | 0.60 | 1.0 | X | D |
| 6 | A(100) | B(100) | 10/20 | — | 300 | 0.50 | 1.2 | Δ | C |

*: A = methyl gallate; B = bis[2-hydroxy-3-(2'-hydroxy-5'-methylbenzyl)-5-methylphenyl]methane; C = 2,3,4,4'-tetrahydroxybenzophenone; D = bis(5-cyclohexyl-4-hydroxy-2-methylphenyl)-3,4-dihydroxyphenylmethane; E = 2,3,4-trihydroxybenzophenone.
**: Z1 = 2,4-bis[1-(4-hydroxyphenyl)isopropyl]-5-hydroxyphenol; Z2 = bis(4-hydroxy-3-methylphenyl)-2-hydroxyphenylmethane; Z3 = bis(4-hydroxy-2,3,5-trimethylphenyl)-2-hydroxyphenylmethane; Z4 = 1,1-di(4-hydroxyphenyl)cyclohexane.
***: Exposure was performed with reduction projection aligner NSR-1505G7E (NIKON Corp.; NA = 0.54; s = 0.6).

Examples 15–28

The resist patterns produced in Examples 1–14 were coated with Ni—Fe films that were deposited by sputtering in a thickness of 0.1 μm. Thereafter, the substrates were immersed in a liquid stripper (HAKURIEKI-104 of Tokyo Ohka Kogyo Co., Ltd.) at 25° C. for 5 min so as to remove away the resist patterns and the overlying Ni—Fe films. The unwanted resist patterns and Ni—Fe films could be lifted off completely whereas the remaining Ni—Fe films had no "chips" in any portions.

Figure 3A:
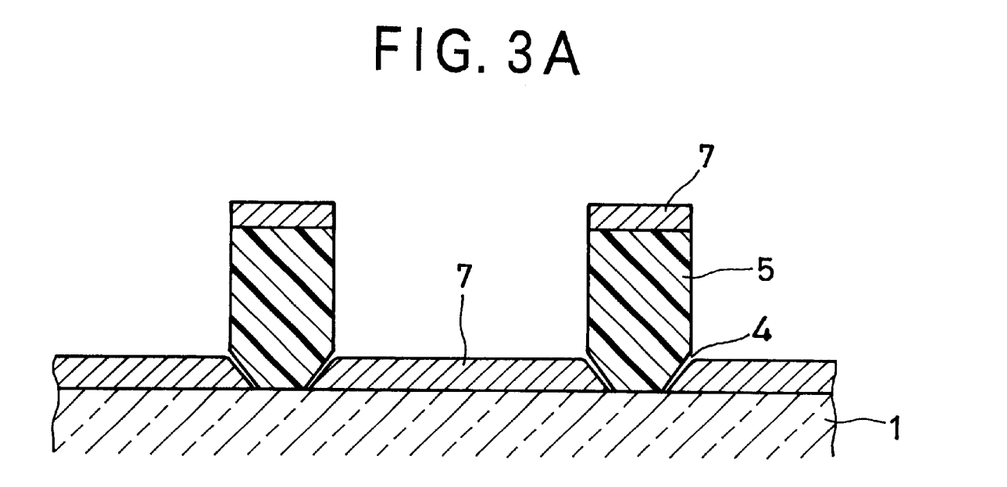
FIG. 3A is a schematic section showing how a Ni—Fe film is formed using the resist pattern obtained in Example 1.
Figure 3B:
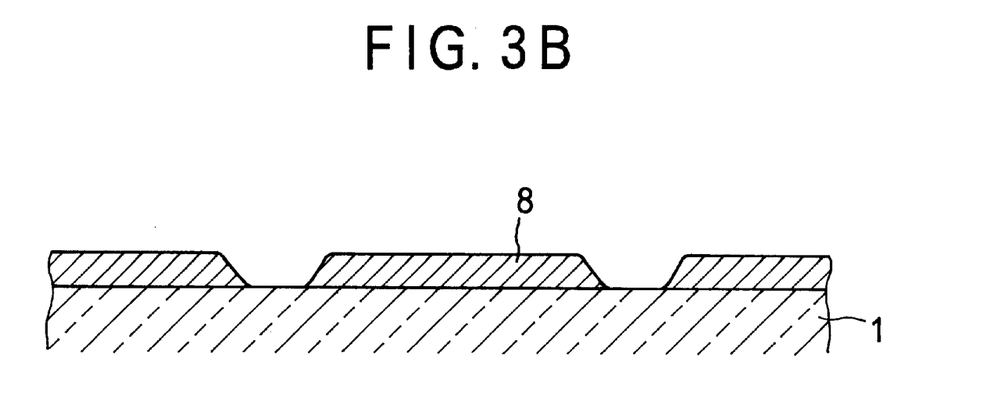
FIG. 3B shows a cross-sectional profile of a patterned Ni—Fe film (patterned metallization) left after stripping the Ni—Fe film together with the underlying resist pattern of FIG. 3A.

FIG. 3A is a schematic section showing how the Ni—Fe film was formed by sputtering in Example 15 (using the resist pattern prepared in Example 1). FIG. 3B shows the cross-sectional profile of the patterned Ni—Fe film (metallization) that remained after removing away the resist pattern and the overlying Ni—Fe film. In FIGS. 3A and 3B, numeral 1 designates the substrate, 4 the micro-groove, 5 the resist pattern, 7 the Ni—Fe film (metallization), and 8 the Ni—Fe pattern (patterned metallization). Obviously, in Example 15, the resist pattern had a sharply defined micro-groove in each element so that the Ni—Fe film (metallization) being deposited filled the space between adjacent pattern elements to produce a patterned Ni—Fe film (metallization) having a rectangular or tapered feature profile which had no "chips" in any portions.

The same results as shown in FIGS. 3A and 3B were obtained in Examples 16–28.

Comparative Examples 7–12

The resist patterns produced in Comparative Examples 1–6 were coated with Ni—Fe films that were deposited by sputtering in a thickness of 0.1 μm as in Examples 15–28. Thereafter, the substrates were immersed in a liquid stripper (HAKURIEKI-104 of Tokyo Ohka Kogyo Co., Ltd.) at 25° C. for 5 min so as to remove away the resist patterns and the overlying Ni—Fe films. The unwanted resist patterns and Ni—Fe films could be lifted off completely but, on the other hand, the remaining Ni—Fe films each had "chips" in one or more areas.

Figure 4A:
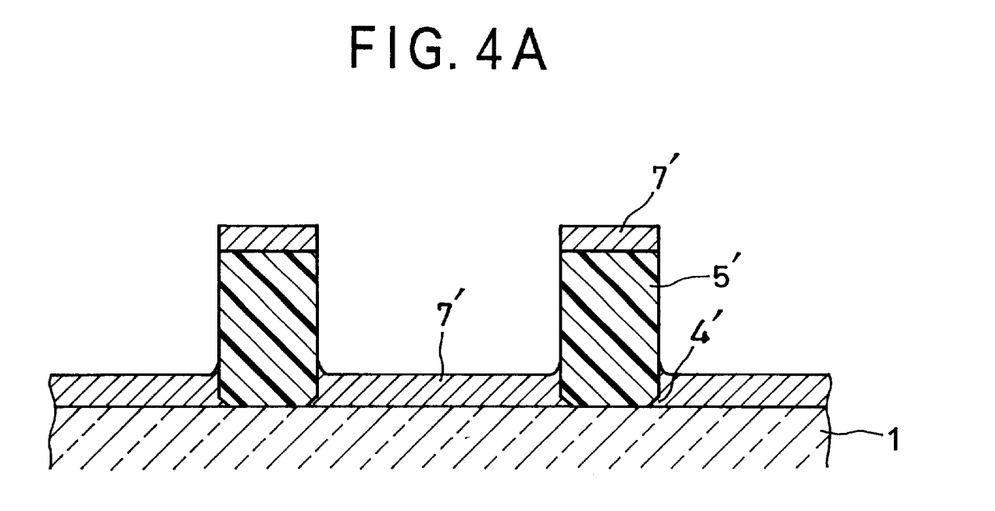
FIG. 4A is a schematic section showing how a Ni—Fe film is formed using the resist pattern obtained in Comparative Example 1.
Figure 4B:
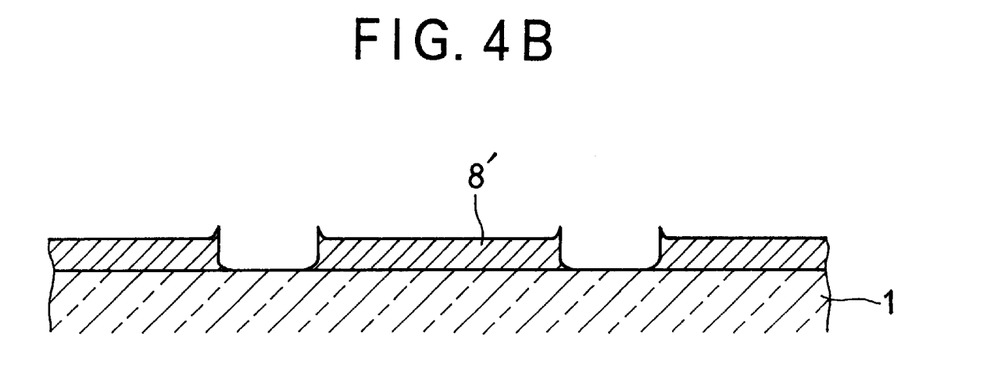
FIG. 4B shows a cross-sectional profile of a patterned Ni—Fe film (patterned metallization) left after stripping the Ni—Fe film together with the underlying resist pattern of FIG. 4A

FIG. 4A is a schematic section showing how the Ni—Fe film was formed by sputtering in Comparative Example 7 (using the resist pattern prepared in Comparative Example 1). FIG. 4B shows the cross-sectional profile of the patterned Ni—Fe film (metallization) that remained after removing away the resist pattern and the overlying Ni—Fe film. Obviously, in Comparative Example 7, the resist pattern 5' did not have a sharply defined micro-groove in any element so that the Ni—Fe film (metallization) 7' formed in such a way as to cover the bottom of each element of the resist pattern 5'; the resulting patterned Ni—Fe film (metallization) 8' had "chips" in one or more areas.

The same results as shown in FIGS. 4A and 4B were obtained in Comparative Examples 8–12.

As will be apparent from the foregoing description, the positive photosensitive composition of the invention for application of the lift-off technique is capable of forming one-half micron meter and even finer patterns having good feature profiles and, hence, assures high reproducibility in forming precise conducting patterns.

Thus, the positive photosensitive composition of the invention for application of the lift-off technique is suitable for use in the formation of conducting metallization patterns in semiconductor devices, as well as in the formation of metal or metal oxide electrodes (terminals) on magnetic heads in magnetic disk devices such as a giant magnetoresistive (GMR) head and a magnetoresistive (MR) head.

What is claimed is:

1. A positive photosensitive composition, which comprises:

(A) an alkali-soluble resin; and (B) a mixture of two photosensitive agents in admixture with the alkali-soluble resin, said first photosensitive agent (i) showing a tendency to form a resist pattern of a feature profile having a micro-groove upon exposure and said second photosensitive agent (ii) not showing the tendency of said first photosensitive agent but showing a tendency to form a resist pattern having a rectangular or tapered cross-sectional feature profile upon exposure, wherein said first photosensitive agent (i) being at least one compound represented by the following general formula (1):

(I)

where X is $OR^1$ (where $R^1$ is a hydrocarbon group of 1–3 carbon atoms) or a residue represented by the following general formula:

(where $R^2$ is a hydrocarbonyl group of 1–3 carbon atoms; m is an integer of 0–2; n is an integer of 1–3, provided that $1 \leq m+n \leq 4$), except that 75–100% of the phenolic hydroxyl groups in compound (I) are esterified with naphthoquinonediazidosulfonic acid alone, and said second photosensitive agent (ii) being at least one compound represented by the following formula (VI):

(VI)

except that 50–75% of the phenolic hydroxyl groups in said compounds are esterified with naphthoquinone-1,2-diazidosulfonic acid alone.

2. The positive photosensitive composition according to claim 1, which further comprises (C) an alkali-soluble phenolic compound having at least two para-hydroxyphenyl groups as a sensitizer.

3. The positive photosensitive composition according to claim 2, wherein the compound represented by the general formula (I) is one represented by the following formula (IV):

(IV)

4. The positive photosensitive composition according to claim 2, wherein the compound represented by the general formula (I) is one represented by the following general formula (V):

(V)

5. The positive photosensitive composition according to claim 2, wherein component (C) is a compound represented by the following formula (VIII):

(VIII)

6. The positive photosensitive composition according to claim 1, which incorporates 25–40 parts by weight of component (B) per 100 parts by weight of component (A).

7. The positive photosensitive composition according to claim 2, which incorporates 30–60 parts by weight of component (C) per 100 parts by weight of component (A).

8. The positive photosensitive composition according to claim 1, wherein the mixing ratio of said first photosensitive agent (i) and said second photosensitive agent (ii) in component (B) ranges from 1:2 to 2:1 by weight.

9. A method of forming a resist pattern for application of the lift-off technique, which comprises:
 coating a substrate with the positive photosensitive composition according to claim 1,
 drying the coating,
 exposing the coating to light at a wavelength of 300–500 nm,
 heat treating the coating at 100–140° C., and
 developing the coating with an aqueous alkaline solution to form the resist pattern.

10. A method of forming a resist pattern for application of the lift-off technique, which comprises:
 coating a substrate with the positive photosensitive composition according to claim 3,
 drying the coating,
 exposing (it) the coating to light at a wavelength of 300–400 nm, (then)
 heat treating the coating at 100–140° C., and
 developing the coating with an aqueous alkaline solution to form the resist pattern.

11. A method of forming a pattern comprising the steps of forming a resist pattern on a substrate by the method according to claim 9, forming a metallization on the entire surface of the substrate including the resist pattern and subsequently removing away the resist pattern to lift off the overlying metallization to thereby form a patterned metallization on the substrate.

12. A method of forming a pattern comprising forming a resist pattern on a substrate by the method according to claim 10, forming a metallization on the entire surface of the substrate including the resist pattern and subsequently removing away the resist pattern to lift off the overlying metallization to thereby form a patterned metallization on the surface.

\* \* \* \* \*